(12) United States Patent
Wu et al.

(10) Patent No.: US 10,149,410 B2
(45) Date of Patent: Dec. 4, 2018

(54) HEAT CONTROL DEVICE FOR POWER EQUIPMENT

(71) Applicant: Accelink Technologies Co., Ltd., Wuhan (CN)

(72) Inventors: Xijie Wu, Wuhan (CN); Qinlian Bu, Wuhan (CN); Guangying Xiao, Wuhan (CN); Chunping Yu, Wuhan (CN); Yuxiang Yang, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 190 days.

(21) Appl. No.: 14/653,121

(22) PCT Filed: Mar. 28, 2013

(86) PCT No.: PCT/CN2013/073345
§ 371 (c)(1),
(2) Date: Jun. 17, 2015

(87) PCT Pub. No.: WO2014/094395
PCT Pub. Date: Jun. 26, 2014

(65) Prior Publication Data
US 2015/0373878 A1 Dec. 24, 2015

(30) Foreign Application Priority Data
Dec. 18, 2012 (CN) .......................... 2012 1 0551000

(51) Int. Cl.
*F28F 13/00* (2006.01)
*F28F 7/00* (2006.01)
(Continued)

(52) U.S. Cl.
CPC ........... *H05K 7/20409* (2013.01); *G02B 6/42* (2013.01); *H01L 23/34* (2013.01); *H01L 23/36* (2013.01);
(Continued)

(58) Field of Classification Search
CPC . H05K 7/20336; F28D 15/0275; F28D 15/02; F28D 5/0213; F28D 7/20518;
(Continued)

(56) References Cited

U.S. PATENT DOCUMENTS 3,406,746 A * 10/1968 Abildgaard ............ B65D 81/03
165/46
4,949,219 A * 8/1990 Moriizumi .............. H01L 23/10
165/185
(Continued)

FOREIGN PATENT DOCUMENTS

CN 1591844 A 3/2005
CN 101137279 A 3/2008
(Continued)

OTHER PUBLICATIONS

International Search Report for Application No. PCT/CN2013/073345 dated Sep. 26, 2013.

*Primary Examiner* — Jason Thompson
(74) *Attorney, Agent, or Firm* — Lerner, David, Littenberg, Krumholz & Mentlik, LLP

(57) ABSTRACT

This invention involves and discloses a heat control device for power equipment, which comprises heat source, heat sink base plate, heat insulation layer, dissipation heat sink and thermal control switch, wherein the heat source is placed on and in contact with dissipation heat sink, and its bottom is in direct lap joint with heat sink base plate, wherein the heat insulation layer is set around heat sink base plate, wherein the thermal control switch is placed on heat sink base plate. This invention of heat control device is one that demonstrates excellent low temperature thermal insulation property for key components or heat-sensitive elements of power equipment. The heat control device applying techni- (Continued)

Figure 1:
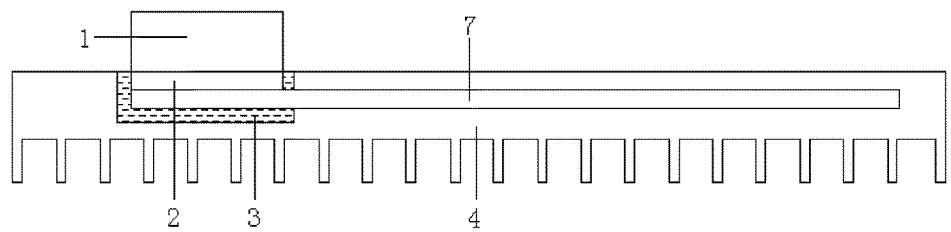

cal solutions described in this invention features easy manufacturing, low cost and reliable performance.

5 Claims, 1 Drawing Sheet

(51) Int. Cl.
    *F28D 15/00*     (2006.01)
    *H05K 7/20*     (2006.01)
    *H01L 23/34*     (2006.01)
    *H01L 23/36*     (2006.01)
    *G02B 6/42*     (2006.01)

(52) U.S. Cl.
    CPC .. *H05K 7/20336* (2013.01); *H01L 2924/0002* (2013.01)

(58) Field of Classification Search
    CPC ............... F28F 2265/10; F28F 2270/00; F28F 2013/005; F28F 2013/006; H01L 23/427; H01L 2023/4068; H01L 2023/4037
    USPC ......... 361/679.47, 679.52, 679.54, 700, 709, 361/710; 165/104.21, 185
    See application file for complete search history.

(56) References Cited

U.S. PATENT DOCUMENTS

| | | | | |
|---|---|---|---|---|
| 5,373,418 | A * | 12/1994 | Hayasi | H01L 23/4006 257/718 |
| 6,209,631 | B1 * | 4/2001 | Garcia-Ortiz | F28D 15/02 165/104.33 |
| 6,315,038 | B1 * | 11/2001 | Chiu | H01L 23/3737 165/185 |
| 8,405,998 | B2 * | 3/2013 | Barowski | H01L 23/3672 174/260 |
| 8,553,417 | B2 * | 10/2013 | Park | H05K 1/053 174/252 |
| 2003/0150604 | A1 * | 8/2003 | Koning | F28F 13/00 165/185 |
| 2005/0046801 | A1 * | 3/2005 | Yamada | F28D 15/0275 353/54 |
| 2005/0199372 | A1 * | 9/2005 | Frazer | F28F 3/12 165/80.4 |
| 2008/0158817 | A1 | 7/2008 | Tsunoda et al. | |
| 2009/0200065 | A1 * | 8/2009 | Otoshi | H01L 23/367 174/252 |
| 2010/0186938 | A1 * | 7/2010 | Murata | C09K 5/14 165/185 |
| 2010/0254092 | A1 * | 10/2010 | Dong | B29C 45/0005 361/705 |
| 2011/0056650 | A1 * | 3/2011 | Ito | F28D 15/00 165/67 |
| 2011/0279970 | A1 | 11/2011 | Guan | |
| 2012/0162921 | A1 * | 6/2012 | Wu | B29C 45/14311 361/714 |
| 2014/0102678 | A1 | 4/2014 | Zou et al. | |
| 2014/0151014 | A1 * | 6/2014 | Zhang | H01L 23/345 165/206 |

FOREIGN PATENT DOCUMENTS

| | | |
|---|---|---|
| CN | 201396607 Y | 2/2010 |
| CN | 103002722 A | 3/2013 |
| GB | 2381377 A | 4/2003 |
| JP | H01192151 A | 8/1989 |
| JP | 2005045121 A | 2/2005 |
| WO | 2011150874 A2 | 12/2011 |

* cited by examiner

HEAT CONTROL DEVICE FOR POWER EQUIPMENT

CROSS-REFERENCE TO RELATED APPLICATIONS

This application is a national phase entry under 35 U.S.C. § 371 of International Application No. PCT/CN2013/073345, filed Mar. 28, 2013, which claims priority to Chinese Patent Application No. 201210551000.1, filed on Dec. 18, 2012, the disclosures of which are incorporated herein by reference.

TECHNICAL FIELD

Embodiment of invention involves a heat dissipation control device for power equipment, in particular, a structural device in the communication field capable of heat dissipation at a high temperature and thermal insulation at a low temperature for power equipment.

BACKGROUND

In the current field of communication technology, a large number of power equipments are applied in communication systems. The heat source and other devices of the power equipment has to work within a certain temperature range, whereas the ambient temperature of power equipment might could reach below zero or above 50° C. To ensure that the heat source and other devices operate in a certain stable temperature range, the power equipment should demonstrate good performance in both thermal insulation at low temperature and heat dissipation at high temperature, so as to provide an effective and stable temperature mechanism for the heat source and other devices.

Existing power equipments for communication have good heat dissipation measure only at high temperature, generally without any thermal insulation measure at low temperature. Thus for thermal insulation of heat source or heat-sensitive devices, a heater or thermoelectric cooler is needed to provide heating power and ensure their operating temperatures of heat source or heat-sensitive devices in a low-temperature environment.

SUMMARY OF INVENTION

On the purpose of overcoming technical problems of prior art, embodiment of invention provides a control device for communication power equipment, with functions of thermal insulation at low temperature and heat dissipation at high temperature.

Technical solutions adopted in embodiment of invention are:

A heat control device for power equipment, comprises a heat source, a heat sink substrate, a thermal insulation layer, a dissipation heat sink and a thermal control switch, wherein the heat source is placed on and in contact with the dissipation heat sink, and bottom surface of the heat source is in direct lap joint with the heat sink substrate, wherein the thermal insulation layer is placed around the heat sink substrate, wherein the thermal control switch is placed on the heat sink substrate.

The thermal control switch is a high heat transfer performance element with varied heat conduction performances at high and low temperatures, wherein one end of the high heat transfer performance element contacts with the heat sink substrate, another end of high heat transfer performance element is embedded in the dissipation heat sink, and the thermal insulation layer is under the high heat transfer performance element, wherein the thermal insulation layer is made up of clearances and thermal insulation material filled within the clearances around the heat source, wherein the high heat transfer performance element is coated in the thermal insulation layer.

The thermal control switch comprises high heat-conductive material device and low heat-conductive material device, Wherein multiple low heat-conductive material devices are set between the heat sink substrate and the dissipation heat sink with a certain distance therebetween, wherein low heat-conductive material devices are in full lap joint contact with the heat sink substrate and the dissipation heat sink, wherein high heat-conductive material device is set among low heat-conductive material device, heat sink substrate and dissipation heat sink, wherein high heat-conductive material device contacts with dissipation heat sink, wherein the thermal insulation layer is made up of closed stagnant air layer between the heat sink substrate and the high heat-conductive material device.

The high heat transfer performance element comprises heat-conductive heat pipes or thermal columns.

The thermal insulation material comprises solid material with low thermal conductivity.

The heat control device for power equipment is characterized in that the thermal insulation material is filled gas with low thermal conductivity.

The heat control device for power equipment is characterized in that the gas with low thermal conductivity is air.

Embodiment of invention has the following advantages:

1. Embodiment of invention provides a heat control device for power equipment, which has good heat dissipation performance at high temperatures and good thermal insulation performance at low temperatures.

2. The heat control device of embodiment of invention is such a device that demonstrates excellent thermal insulation performance at low temperature, for key components or heat-sensitive components of power equipment. The heat control device applying technical solutions described in embodiment of invention features easy manufacturing, low cost and reliable performance.

DESCRIPTIONS OF FIGURES

Figure 2:
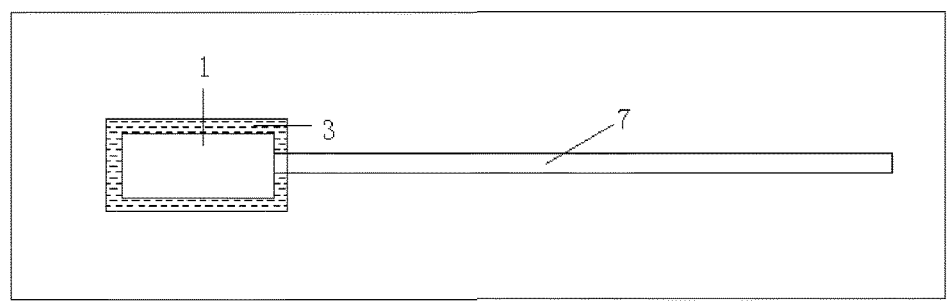
Figure 3:
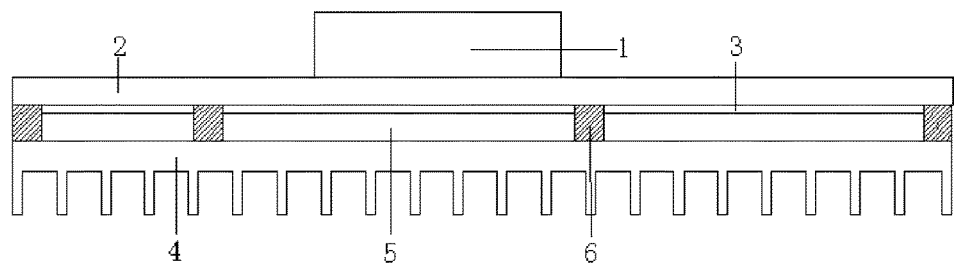

FIG. 1 is a vertical sectional drawing of structure of the First Embodiment of the Invention, FIG. 2 is a top view of structure of the First Embodiment of the Invention, FIG. 3 is a vertical sectional drawing of structure of the Second Embodiment of the Invention, wherein,

| | |
|---|---|
| 1: heat source | 2: heat sink substrate |
| 3: thermal insulation layer | 4: dissipation heat sink |
| 5: high heat-conductive material device | 6: low heat-conductive material device |
| 7: high heat transfer performance element | |

EMBODIMENTS

The implementation method of embodiment of invention shall be explained in detail with specific embodiments and figures as below.

The temperature control device for power equipment of embodiment of the invention with functions of heat dissipation and thermal insulation, comprises: heat sink substrate of heat source, thermal insulation structure, dissipation heat sink and thermal control switch, wherein the heat source is placed on and in contact with the dissipation heat sink, and bottom surface of the heat source is in direct lap joint with the heat sink substrate, the thermal insulation layer is set around the heat sink substrate, the thermal control switch is set on the heat sink substrate. The heat source of the heat control device for power equipment of embodiment of the invention may be an optical module. The control device for power equipment of embodiment of the invention has two embodiments of structural configuration.

The first embodiment is shown in FIG. 1, comprising heat sink substrate 2 in contact with heat source 1, thermal insulation layer 3, dissipation heat sink 4 and thermal control switch, wherein the thermal control switch is a high heat transfer performance element 7, wherein heat source 1 is placed on dissipation heat sink 4, with bottom surface of the heat source 1 in direct lap joint with heat sink substrate (2), area around the heat source 1 is hollowed, and clearance is provided around the heat source 1. As shown in FIG. 2, thermal insulation layer 3 is set in the clearance, that is, thermal insulation layer 3 is made up of thermal insulation material filled in the clearance around the heat source. Thermal insulation material in this embodiment may be solid material with low thermal conductivity, or filled gas with low thermal conductivity, which is generally filled air. Heat sink substrate 2 is in well contact with one end of the high heat transfer performance element 7 with thermal insulation layer 3 thereunder, and this end of the high heat transfer performance element 7 is coated with the thermal insulation layer 3 while another end is well embedded into dissipation heat sink 4. Thermal conductivity coefficient of the high heat transfer performance element 7 is very large at high temperature and decreases at low temperature. With its varying conductivity at high and low temperatures, it is possible for this device to realize desirable heat dissipation at high temperature and thermal insulation at low temperature.

The thermal control switch of this embodiment may be an element with high heat transfer performance, one type of which is heat-conductive heat pipe or thermal column Since working medium of the thermal conductivity of heat-conductive heat pipe or thermal column changes physically at high and low temperatures, and heat-conductive capacity of the thermal conductivity of heat-conductive heat pipe or thermal column changes differently at high and low temperatures, temperature variations of the heat source at high and low temperatures can be controlled to achieve fast heat dissipation at high temperature and thermal insulation at low temperature of the heat source.

For the first embodiment of invention, when the working temperature of the power equipment is high, heat generated by power consumption of the heat source 1 is quickly conducted to the heat sink substrate 2 of the heat source, which is in close lap joint with the high heat transfer performance element 7, another end of which is well embedded into the dissipation heat sink (4). Through this structure, heat generated by heat source 1 is quickly conducted to dissipation heat sink 4, and the dissipation heat sink 4 has good heat dissipation performance to reduce the temperature of heat source 1. When the power equipment is working at a low temperature, heat generated by power consumption of heat source 1 is conducted by the same heat-conductive path as above-described, wherein heat generated by power consumption of the heat source 1 is dissipated mainly by dissipation heat sink 4. But at a low temperature, since heat source is coated by thermal insulation layer 3 and its generated heat can only be conducted through the high heat transfer performance element 7. At this time, working medium of the high heat transfer performance element 7 is solidified at low temperature, leading to lower thermal conductivity and lower heat conduction speed of the high heat transfer performance element 7, so as to slow down the cooling rate of heat source 1 and realize the purpose of thermal insulation. So the target of thermal insulation for heat source 1 in this embodiment is achieved through reducing the thermal conductivity and conduction speed of the high heat transfer performance element 7, slowing down the cooling rate of heat source 1 when the working medium of the high heat transfer performance element 7 is solidified at low temperature and high heat-conductive mechanism stops working.

The second embodiment is shown in FIG. 3, comprising heat sink substrate 2 in contact with heat source 1, thermal insulation layer 3, dissipation heat sink 4 and thermal control switch, wherein the thermal control switch comprises high heat-conductive material device 5 and low heat-conductive material device 6, wherein the bottom surface of the heat source 1 is in direct lap joint with heat sink substrate 2, below which there are multiple low heat-conductive material devices 6, wherein there is a dissipation heat sink 4 set below the low heat-conductive material devices 6, wherein multiple low heat-conductive material devices 6 are set between heat sink substrate 2 and dissipation heat sink 4 with a certain distance therebetween, wherein low heat-conductive material devices 6 are in complete lap joint contact with heat sink substrate 2 of heat source and dissipation heat sink 4, wherein high heat-conductive material device 5 is set among low heat-conductive material device 6, heat sink substrate 2 and dissipation heat sink 4, wherein high heat-conductive material device 5 contacts with dissipation heat sink 4, but is not contact with heat sink substrate 2 with thermal insulation layer 3 therebetween, wherein the thermal insulation layer 3 is made up of closed stagnant air layer between heat sink substrate 2 and high heat-conductive material device.

In the second embodiment, when the power equipment is working at high temperature, high heat-conductive material device 5 itself expands due to the high temperature and deforms to fill up the air layer and completely contacts with the heat sink substrate 2 of the heat source, thereby heat generated by power consumption of the heat source 1 is quickly conducted to dissipation heat sink 4 through high heat-conductive material device 5, the heat of the heat source 1 is dissipated via the dissipation heat sink, so as to reduce the temperature of heat source 1. When the power equipment works at a low temperature, high heat-conductive material device 5 shrinks and deforms and detaches from heat sink substrate 2 of heat source to form a closed stagnant air layer, which functions as a thermal insulation layer. Heat generated by power consumption of heat source 1 is conducted to dissipation heat sink 4 mainly through low heat-conductive material devices 6 and air layer, both of which have low thermal conductivity coefficient and poor conduction performance. As a result, the heat conduction speed of heat generated by power consumption of heat source 1 to dissipation heat sink 4 is very slow, satisfying the purpose of thermal insulation with the second embodiment.

Both embodiments of invention involving the heat control device of power equipment adopt the technical solution of controlling the temperature changes of heat source at high and low temperatures through thermal control switch. The thermal control switch involved in embodiment of invention is realized through the above-mentioned two embodiments, which comprise such components as a heat sink substrate in contact with a heat source, a thermal control switch, a dissipation heat sink, wherein the thermal control switch can be made up of high heat-conductive material device and low heat-conductive material device, or made up of high heat transfer performance element. Thermal control heat-conductive material has high heat-conductivity at high temperature and low heat-conductivity at low temperature. When the power equipment operates at a high temperature, the thermal control switch is turned on, and heat energy from the heat source is transferred to dissipation heat sink through the high heat-conductive material device or high heat transfer performance element which is in high heat-conductivity performance. Dissipation heat sink dissipates heat and reduces the temperature of the heat source. When the power equipment operates in a low temperature, heat transfer path between the heat source and dissipation heat sink is formed from lap joint through low heat-conductive material structure, or the high heat transfer performance element which is in high heat-conductivity condition, while the thermal insulation layer can isolate or prevent heat transferring from heat source to the dissipation heat sink, so as to fulfill its function of thermal insulation for the heat source.

Though embodiment of invention has described and shown in detail related specific embodiments for reference, technical persons in this field should understand that all various modifications that might be developed in the form or particulars, without departing from the concept and scope of embodiment of invention, are covered in the protection scope as requested in claim of rights of embodiment of invention.

The invention claimed is:

1. A heat control device for power equipment including a heat source, comprising a heat sink substrate, a thermal insulation layer, a dissipation heat sink and a thermal control switch,
   wherein the heat source includes a bottom surface configured to be in direct contact with the heat sink substrate, the dissipation heat sink arranged at least underlying both the heat source and the heat sink substrate, a space provided between the dissipation heat sink and the heat sink substrate; wherein the thermal insulation layer is arranged in the space and underlying and in contact with at least one side of the heat sink substrate, the thermal insulation layer providing thermal insulation between the dissipation heat sink and the heat source and the heat sink substrate; and wherein the thermal control switch comprises heat conducting material having different heat conductivity at different temperatures, the thermal control switch arranged at least in the space and in contact with the heat sink substrate, the dissipation heat sink and the thermal insulation layer,
   wherein the heat conducting material comprises a heat transfer element having different heat conductivity at different temperatures, wherein one end of the heat transfer element is in contact with the heat sink substrate, another end of the heat transfer element is embedded in the dissipation heat sink, and wherein the thermal insulation layer is provided underlying and on at least one side of the heat sink substrate, wherein at least a portion of the heat transfer element underlying the heat sink substrate is coated with the thermal insulation layer.

2. The heat control device for power equipment in claim 1, wherein the thermal insulation material comprises solid material.

3. The heat control device for power equipment in claim 1, wherein the thermal insulation material comprises a gas.

4. The heat control device for power equipment in claim 3, wherein the gas comprises air.

5. A heat control device for power equipment, comprising a heat source, a heat sink substrate, a thermal insulation layer, a dissipation heat sink and a thermal control switch,
   wherein the heat source includes a bottom surface in contact with the heat sink substrate and in thermal contact with the dissipation heat sink; wherein the thermal insulation layer is arranged underlying and in contact with at least one side of the heat sink substrate; and wherein the thermal control switch is in contact with the heat sink substrate; and
   wherein the thermal control switch comprises a first heat-conductive material device and a plurality of second heat-conductive material devices, wherein a heat conductivity of the first heat conductive material device is greater than a heat conductivity of the plurality of second heat conductive material devices; and
   wherein the plurality of second heat-conductive material devices are arranged between the heat sink substrate and the dissipation heat sink with a distance therebetween, and the plurality of second heat-conductive material devices are in contact with the heat sink substrate and the dissipation heat sink, wherein the first heat-conductive material device is arranged between the second heat-conductive material devices, the first heat-conductive material device having a first surface arranged underlying the heat sink substrate providing a gap therebetween and an opposing second surface in contact with the dissipation heat sink, wherein the thermal insulation layer comprises the gap formed by a closed stagnant air layer between the heat sink substrate and the first surface of the first heat-conductive material device.

* * * * *